(12) United States Patent
Kern

(10) Patent No.: US 9,829,542 B2
(45) Date of Patent: Nov. 28, 2017

(54) CIRCUIT FOR MEASURING POWER VIOLATIONS USING HIGH SIDE CURRENT SENSING

(71) Applicant: Microchip Technology Incorporated, Chandler, AZ (US)

(72) Inventor: Lynn Russell Kern, Tucson, AZ (US)

(73) Assignee: MICROCHIP TECHNOLOGY INCORPORATED, Chandler, AZ (US)

( * ) Notice: Subject to any disclaimer, the term of this patent is extended or adjusted under 35 U.S.C. 154(b) by 253 days.

(21) Appl. No.: 14/709,881

(22) Filed: May 12, 2015

(65) Prior Publication Data

US 2015/0331064 A1    Nov. 19, 2015

Related U.S. Application Data

(60) Provisional application No. 61/993,508, filed on May 15, 2014.

(51) Int. Cl.
| | |
|---|---|
| *G01R 27/08* | (2006.01) |
| *G01R 21/00* | (2006.01) |
| *G01R 31/42* | (2006.01) |
| *G01R 19/165* | (2006.01) |
| *G01R 31/40* | (2014.01) |

(52) U.S. Cl.
CPC ....... *G01R 31/42* (2013.01); *G01R 19/16547* (2013.01); *G01R 31/40* (2013.01)

(58) Field of Classification Search
CPC ... G01R 31/42; G01R 31/40; G01R 19/16547
USPC .............................. 324/713, 764.01; 702/60
See application file for complete search history.

(56) References Cited

U.S. PATENT DOCUMENTS

| | | | |
|---|---|---|---|
| 3,775,675 A | 11/1973 | Freeze et al. | 324/547 |
| 3,789,293 A | 1/1974 | Freeze | 324/102 |
| 2003/0014200 A1* | 1/2003 | Jonker | G01R 21/133 702/60 |
| 2014/0218008 A1* | 8/2014 | Ewing | H04Q 9/00 324/76.11 |

FOREIGN PATENT DOCUMENTS

| | | | | |
|---|---|---|---|---|
| JP | 2010110132 A | 5/2010 | | G01R 31/36 |
| JP | 2011041410 A | 2/2011 | | H02H 3/04 |

OTHER PUBLICATIONS

International Search Report and Written Opinion, Application No. PCT/US2015/031043, 9 pages, dated Jul. 30, 2015.

* cited by examiner

*Primary Examiner* — Farhana Hoque
(74) *Attorney, Agent, or Firm* — Slayden Grubert Beard PLLC

(57) ABSTRACT

A power monitoring circuit and method for detecting deviations in the output of a power supply. The power monitor is configured to detect and measure two different types of deviations: transient deviations short surges or spikes in the current drawn by the device being powered and prolonged deviations over a threshold current that may be intentional, temporary increases in the output of the power supply. The power monitor collects information such as the number of each type of deviation, the duration of each deviation and the peak current describing identified deviations. This collected information can then be used, especially during the development phase, to locate the root cause of the deviation. The components of the power monitor used to detect and measure these deviations may be disabled and enabled as needed.

24 Claims, 2 Drawing Sheets

CIRCUIT FOR MEASURING POWER VIOLATIONS USING HIGH SIDE CURRENT SENSING

CROSS-REFERENCE TO RELATED APPLICATIONS

This application claims the benefit of U.S. Provisional Application No. 61/993,508 filed on May 15, 2014, which is incorporated herein in its entirety.

TECHNICAL FIELD

The present disclosure relates to current monitoring in power supplies, in particular detecting and measuring deviations in the output of a power supply using high side current sensing.

BACKGROUND OF THE INVENTION

Power monitors are used to measure and track the power that is supplied to electronic devices via a power supply. Power supplies are designed to provide regulated levels of power to an electronic device, but significant deviations in the actual power output of a power supply occur regularly. These deviations in the output of a power supply can be categorized into two general categories. The first type are brief, unintended surges or spikes in the current drawn by the peripheral device being powered by the supply. These transient spikes can have a wide range of causes and can potentially be damaging. A second type of deviations are sustained increases in the current drawn on the power supply. This second type of deviation is sometimes the result of intended, temporary increases in the output of the power supply.

The first type of deviation occurs when the current drawn by the electronic device surges and results in a transient spike in the power output of the supply. Power supplies typically include circuitry to prevent such spikes that surpass a magnitude that could cause damage to components of the device circuitry. Even relatively minor power surges that do not trigger the circuit protection components of a power supply can still result in damage due to their cumulative effects. Detecting and measuring these events can provide information useful for diagnosing the cause of the surges, especially during the electronic device's development phase.

The second type of deviation may occur due to a malfunction, but will frequently occur by design in certain devices. In high performance portable computing products (e.g., smartphones, tablets, netbooks and laptops), power supplies typically include features that allow for elevated power levels to be provided. Power supplies are provided with specifications that define 100% power output for the supply. Certain devices also provide a "turbo" mode, that allows the power supply to exceed 100% output levels for a specified amount of time. For instance, a power supply that supports turbo mode can provide (100+X)% power over Y period of time, where X and Y are power supply dependent. As with the first type of event, these prolonged deviations in power output can result in damage to the device over time. Consequently, monitoring the duration and frequency of such events provides designers with information that can be used to anticipate possible damaging side-effects and to promote long-term reliability.

The physical overstress resulting from both types of deviations may cause failure over time and any effects of such damage must be addressed. However, these two types of deviations differ in that certain of the prolonged violations are by design. As a result, it is advantageous to differentiate between these two types of deviations in the power supply output. It is also advantageous to provide information describing each deviation, with the information tailored to the type of deviation that is observed. Such information is especially helpful during the development cycle, when identification of a component suffering from power malfunctions must be identified. Any information captured by the power monitor describing a power malfunction can be used to diagnose the offending component causing the malfunction.

Conventional power monitors do not provide the ability to effectively detect and measure the excessive current drawn during both types of deviations. Instead, conventional systems tend to approximate the magnitude of deviations in the power supply output based on information such as temperature measurements. Not only are such approximations unreliable in discerning actual deviations in the output of the power supply, they do not provide accurate information regarding the magnitude and duration of deviations. The lack of reliable and accurate information precludes effective diagnosis of the underlying issues that cause the deviations.

SUMMARY OF THE INVENTION

In order to improve the ability to diagnose the root cause of deviations in the output of a power supply, a need exits for a power monitor that is capable to detect, measure and provide diagnostic information regarding these deviations. Additionally, a need exists for a power monitor that is capable of detecting both transient and prolonged deviations in the output of a power supply and providing information describing deviations of each type.

According to embodiments, a power monitoring circuit comprises monitoring circuitry configured to detect and count transient deviations in the output current of a power supply, wherein the transient deviations are detected based on the output current and a first threshold current; and monitoring circuitry configured to detect and measure prolonged deviations in the output current of the power supply, wherein the prolonged deviations are detected based on the output current, a second threshold current and a duration threshold In another embodiment, the power monitor also comprises a shunt resistor for determining the output current of the power supply. In another embodiment, the first threshold current and the second threshold current used by the power monitor are the same. In another embodiment, the power monitor further comprise monitoring circuitry configured to store the peak current of the power supply output measured during a detected transient deviation. In another embodiment, the power monitor further comprises monitoring circuitry configured to track and store the number of detected transient deviations. In another embodiment, the power monitor further comprises monitoring circuitry configured to store the duration of detected prolonged deviations in the output current of the power supply. In another embodiment, the power monitor further comprises monitoring circuitry configured to calculate a total deviation output energy of the power supply during the duration of detected prolonged deviations. In another embodiment, the monitoring circuitry that calculates the total deviation output comprises an integrating sampler. In another embodiment, the integrating sampler does not include the output current of the power supply that is below the threshold current in calculating the total deviation output energy. In another embodiment, the monitoring circuitry can be enabled and disabled.

BRIEF DESCRIPTION OF THE DRAWINGS

The present invention may be better understood, and its numerous objects, features, and advantages made apparent to those skilled in the art by referencing the accompanying drawings. The use of the same reference symbols in different drawings indicates similar or identical items.

DETAILED DESCRIPTION

The disclosure and various features and advantageous details thereof are explained more fully with reference to the exemplary, and therefore non-limiting, embodiments illustrated in the accompanying drawings and detailed in the following description. Descriptions of known programming techniques, computer software, hardware, operating platforms and protocols may be omitted so as not to unnecessarily obscure the disclosure in detail. It should be understood, however, that the detailed description and the specific examples, while indicating the preferred embodiments, are given by way of illustration only and not by way of limitation. Various substitutions, modifications, additions and/or rearrangements within the spirit and/or scope of the underlying inventive concept will become apparent to those skilled in the art from this disclosure.

Additionally, any examples or illustrations given herein are not to be regarded in any way as restrictions on, limits to, or express definitions of, any term or terms with which they are utilized. Instead these examples or illustrations are to be regarded as being described with respect to one particular embodiment and as illustrative only. Those of ordinary skill in the art will appreciate that any term or terms with which these examples or illustrations are utilized encompass other embodiments as well as implementations and adaptations thereof which may or may not be given therewith or elsewhere in the specification and all such embodiments are intended to be included within the scope of that term or terms.

In embodiments of the claimed invention, two forms of deviations in the output of a power supply are detected and measured. As described, the first type of deviation are spikes in the current drawn by the peripheral device connected to the power supply. This first type of deviation will be referred to as a Type 1 deviation. The second type of deviations are sustained increases in the output of the power supply (e.g., turbo mode). The second type of deviation will be referred to as a Type 2 deviation.

Figure 1:
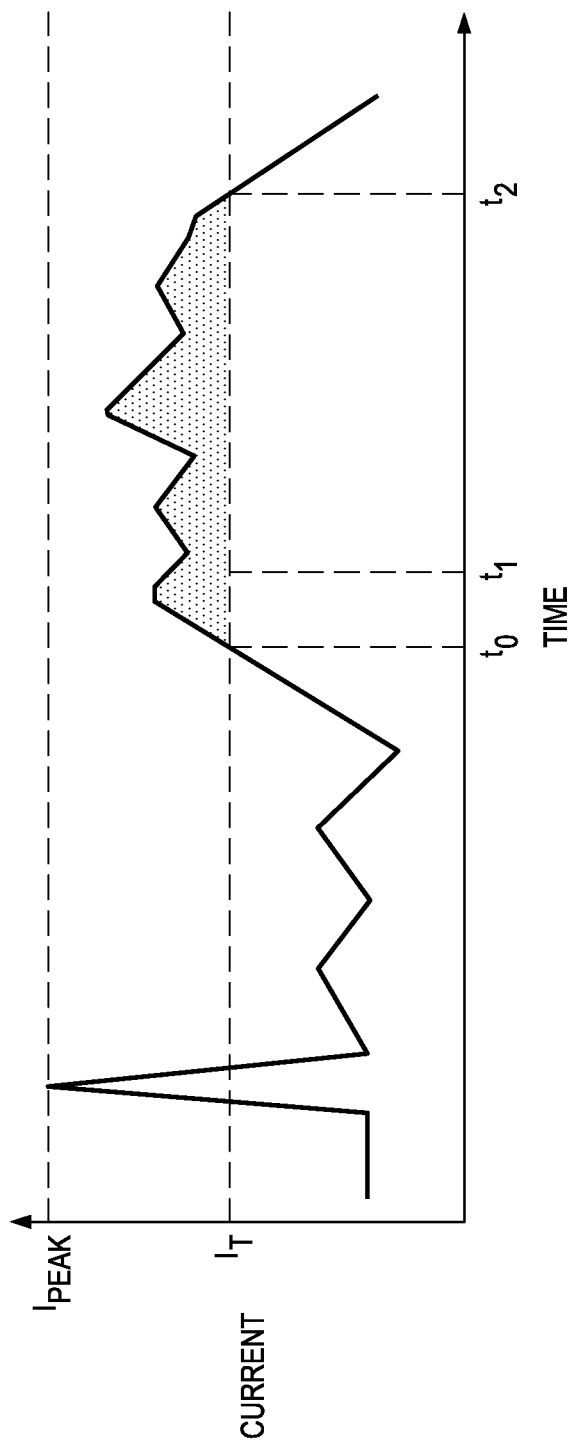
FIG. 1 depicts a time series of the current values that illustrate two different types of deviations in output of a power supply.

The two types of deviations are visualized in FIG. 1, which is a time series graph of the output current of a power supply. As illustrated in FIG. 1, Type 1 deviations are characterized by their short duration. Embodiments will assign various criteria for detecting Type 1 events. Certain embodiments will classify deviations as Type 1 based on the amplitude of the measured peak current above a given threshold. In FIG. 1, the Type 1 deviation is classified by its peak current amplitude $I_{PEAK}$ above a threshold current $I_T$. In certain embodiments, a Type 1 deviation may also be classified by the duration of time that the measured current remains above $I_T$. Various embodiments will be able to detect and identify Type 1 deviations based on such criteria and be able to report this information describing the deviation. Various embodiments will report the peak amplitude of the deviation, the duration of an deviation, and/or the total number of Type 1 deviations detected within a specific timespan. Certain embodiments will provide the ability to use configurable values for a threshold current used in detecting Type 1 deviations.

Referring again to FIG. 1, Type 2 deviations are characterized by their prolonged duration. As with Type 1 deviations, embodiments will assign various criteria for detecting and measuring Type 2 events. Certain embodiments will measure Type 2 deviations based on the sum of the current drawn above a threshold current. In FIG. 1, this measurement of the Type 2 deviation is represented by the shaded area, which is the integrated current above threshold current $I_T$. Certain embodiments will detect deviations based on the duration of time the current remains above a threshold. In FIG. 1, the Type 2 deviation is detected based on an initial amount of time $(t_1-t_0)$ during which current remains above threshold current $I_T$. Certain embodiments will measure and detect Type 2 deviations and be configurable to report information describing this deviation whereby the information can be used for further analysis of the deviation. Certain embodiments will provide the ability to use configurable values for the threshold current and/or the minimum duration used for detecting Type 2 deviations.

Figure 2:
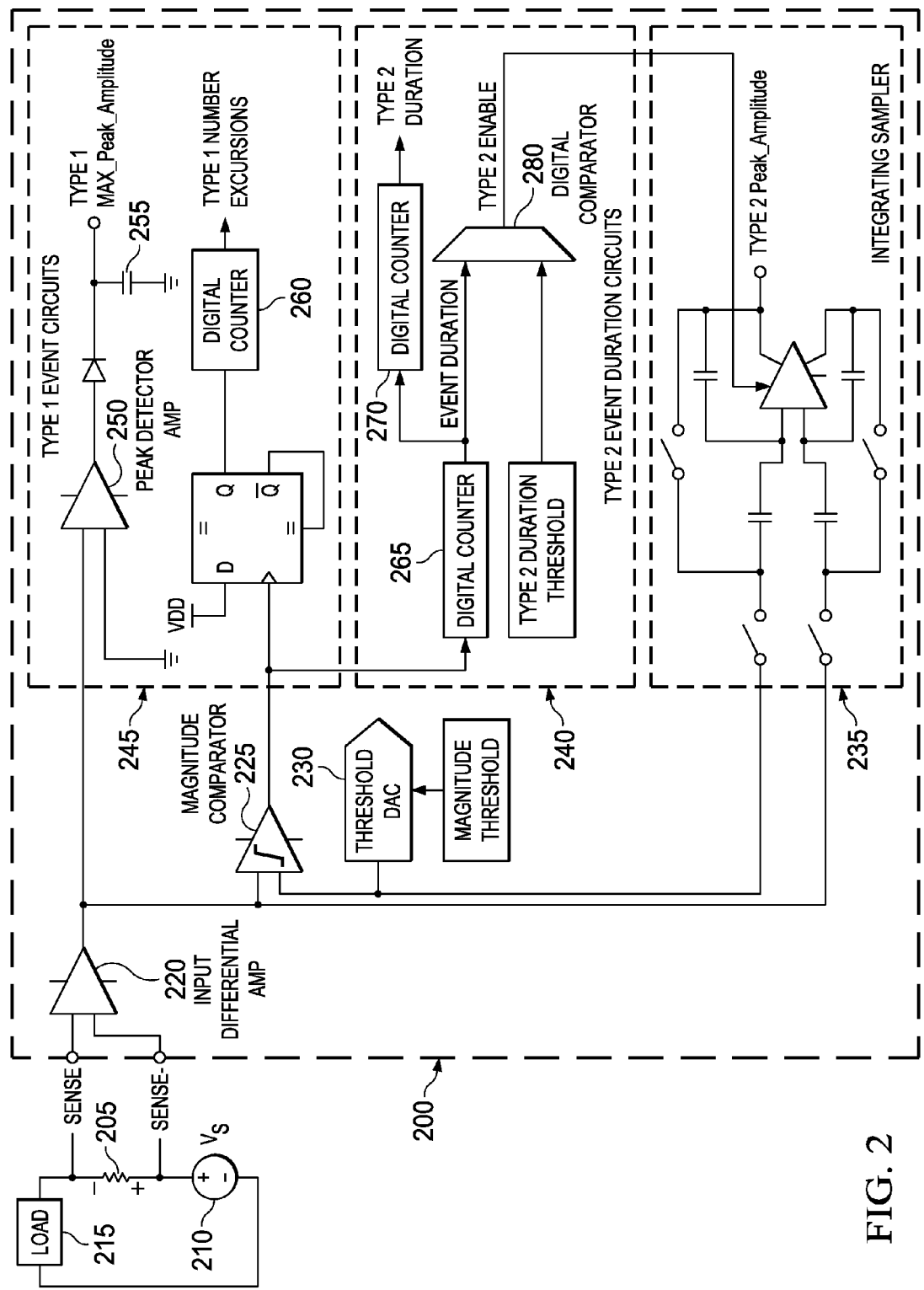
FIG. 2 illustrates an exemplary embodiment of a power minoring circuit according to the claims.

FIG. 2 shows a block diagram of an embodiment of a high-side power monitor 200 comprising analog and digital components implementing a power monitoring circuit. In this embodiment, analog circuitry is used to implement a differential input amplifier 220, a peak detector 250, a magnitude comparator 250 and an integrating sampler 235. The remaining circuitry in the embodiment of FIG. 2 is digital. In the embodiment of FIG. 2, the power monitor 200 is used to detect and measure deviations in the output of power supply 210. The output of power supply 210 is used to power a load 215. The load 215 is an electronic device that can potentially be damaged due to deviations in the output of power supply 210. Power monitor 200 is designed to detect and measure both Type 1 and Type 2 deviations in the output of power supply 210. The information generated by power monitor 200 can be used to diagnose the root cause of the deviations in the output power, while differentiating between Type 1 and Type 2 deviations.

In the embodiment of FIG. 2, the high-side power monitor 200 measures the output of the power supply 210 using a shunt resistor 205. Embodiments will utilize a shunt resistor 215 with a small resistance, typically less than 0.010 ohms. In typical electronic devices, this will result in a 10 mV to 80 mV across the shunt resistor. The power monitor 200 measures the voltage across shunt resistor 205 to measure the current drawn by load 215. Power monitor 200 receives the generated current sense signals as an input to an input differential amplifier 220 that is used to measure the difference between the two current sense signals, which provides a measure of the current drawn by load 215. Other power monitor embodiments may use different components and/or integrated circuits for measuring the current drawn by the load 215 on the power supply 210.

In the embodiment of FIG. 2, the measured current drawn by load 215 is determined by the input differential amplifier 220 and provided as an output. The measured current output of the input differential amplifier is used as one input of a magnitude comparator 225 that determines whether the load 215 is presently drawing current in excess of a predefined threshold. The second input of the magnitude comparator 225 is a signal specifying a predefined threshold current. In the embodiment of FIG. 2, the threshold current is stored in a register and converted to an analog signal using DAC 230. Other power monitor embodiments may use different components and/or integrated circuits for measuring whether the current drawn by load 215 is above a threshold. Certain embodiments may use multiple different predefined threshold currents that can be separately used in the detection of Type 1 and Type 2 deviations. The analog signal representing the threshold current that is generated by DAC 230 is used by the magnitude comparator 225 in determining whether the drawn current is above a predefined threshold.

An advantage provided by embodiments is the ability selectively enable and disable internal components of the power monitor based on whether a potential deviation in the power output has been detected. This ability to disable certain components allows power monitor embodiments to provide detection of power output deviations while minimizing the energy consumed by the power monitor itself. In certain embodiments, certain components of the power monitor may also be enabled and disabled based the operating state of the power supply. For instance, if a signal specifies that the power supply being monitored is presently in a low power state, certain components of the power monitor may be disabled in order to minimize the power consumption of the monitor. However, during a high power state, for instance during the turbo-boost power mode described earlier, all components of the power monitor would be enabled. In certain embodiments, certain components of the power monitor may instead be enabled and disabled based on a signal indicating that the power supply is being used for development or is in production. Since the diagnostic capabilities of the power monitor may be used exclusively during the development stage, certain components of the power monitor may be disabled once a device goes from a development stage to a production stage.

In the embodiment of FIG. 2, the output of the magnitude comparator 225 is used to signal whether the event detection circuits should be enabled. More specifically, if the magnitude comparator 225 signals that the output current is above a threshold current, this serves to enable the Type 1 event detection circuitry 245 and the Type 2 event duration circuitry 240. Once enabled, the power monitor 200 begins tracking the threshold violation to determine if it is a Type 1 and/or Type 2 deviation.

The Type 1 event detection circuitry 245 is used to measure and count the Type 1 deviations in the output current of power supply 210. Once the Type 1 event detection circuitry 245 has been enabled, it begins tracking the current measurements outputted by the input differential amp 220. The peak detector amplifier 250 is used in conjunction with a diode and a storage capacitor 255 to track the current measurements and store the peak current that is observed over a certain time interval. The measured current is used to charge the storage capacitor 255. The charge of the storage capacitor 255 increases along with the measured current, but the diode prevents the storage capacitor 255 from discharging. In this manner, the Type 1 event detection circuit stores the peak observed current. Other embodiments of the power monitor may utilize different and/or additional components or integrated circuits to detect and measure peaks in the output current of power supply 210.

The Type 1 event detection circuit also may also include that ability to digitize the peak current value stored in capacitor 255. In certain embodiments, the peak value stored in capacitor 255 is stored in a dedicated register. This peak value may be periodically stored to a register based on confirmation that a peak has been detected or upon a determination by the magnitude comparator 225 that the current drawn by load 215 has dropped below the threshold current, thus signaling the end of the transient deviation. Embodiments storing measured peak values in a register may also include software functions that are configured to periodically read these values from the register for use in generating reports that describe the detected Type 1 deviations.

In addition to identifying peaks, the Type 1 even detection circuit in the embodiment of FIG. 2 also includes a digital counter 260 for tracking the number of discrete Type 1 deviations that is measured and stored by the peak detection amplifier 250 and the storage capacitor 255. Each time the current exceeds the threshold current, digital counter 260 increments, thus maintaining a running total of the Type 1 deviations in the output of the power supply 210.

In certain embodiments, the number of deviations tracked by the digital counter 260 is stored in a dedicated register where it can be accessed by software functions configured to provide reports on the deviations detected by the power monitor 200. Along with the software functions used to collect measurements of peak values made by the peak detector amplifier 250 and storage capacitor 255, the software functions that collect the running count of deviations may be used in certain embodiments for generating reports detailing the magnitude and number of Type 1 deviations in the power supply 210. Such reports can be used, especially during the development cycle, to identify the root cause of these transient deviations and gauge the potential damage that could result from such deviations.

The Type 2 event duration circuitry 240 is also enabled by a determination by the magnitude comparator 225 that the current drawn by load 215 is above the threshold current. In the embodiment of FIG. 2, the Type 2 event duration circuitry 240 is comprised of a digital counter 265 that tracks the number of consecutive cycles the current drawn by load 215 remains above the threshold current, with the magnitude comparator 225 determining at each cycle whether the threshold current has been exceeded. The running tally tracked by digital counter 265 is compared by digital comparator 280 against a Type 2 duration threshold, which specifies the minimum duration for a deviation in the output current to be classified as a Type 2 deviation. This running tally tracked by digital counter 265 is additionally tracked by digital counter 270, with that tally tracked by digital counter 270 being used to measure the duration of the Type 2 deviation. The duration is represented by the interval $(t_2-t_0)$ in the Type 2 deviation depicted in FIG. 1.

When a Type 2 deviation has been detected based on the determination made by digital comparator 280, the count maintained by digital counter 270 can be used to provide an output specifying the duration of each Type 2 deviation. This duration information generated by digital counter 270 can then be collected using software functions and may be used for generating reports that describe the Type 2 deviations detected by power monitor 200. In some embodiments, the Type 2 duration threshold and the duration of the deviation as determined by digital counter 270, are stored in a dedicated registers. In certain embodiments, the units used to represent the Type 2 duration threshold will be the number of consecutive cycles during which the current draw remains below the threshold value.

Based on the comparison made by digital comparator 280, integrating sampler 235 is enabled. The digital comparator 280 receives the running tally of consecutive current measurements that exceed the current threshold and compares it against the Type 2 duration threshold, which is the minimum duration that has been configured for Type 2 deviations. Thus, if the duration of the deviation surpasses this lower threshold, the digital comparator 280 outputs a signal that enables the integrating sampler 235, which will measure the total amount of current during the Type 2 deviation.

The integrating sampler 235 measures the total power that is output by the power supply 210 throughout the duration of a Type 2 deviation. The integrating sampler 235 measures the magnitude of the deviation at periodic intervals and sums these periodic measurements. As inputs, the integrating sampler 235 receives the measurement of the current drawn by load 215 from the input differential amplifier 220 and the threshold current from the threshold DAC 230. At each interval, the integrating sampler 235 measures the voltage resulting from the current received from the input differential amplifier 220 is it charges a feedback capacitor. This serves to integrate the incoming current measurement signal received from the input differential amplifier 220. After each interval, the integrating sampler 235 auto-zeroes back to the threshold current before beginning the next sample reading of the voltage on the feedback capacitor. This allows the integrating sampler 235 to subtract the threshold current from the measured current, so that only the measured current over the threshold current is added to the sum during each interval. This sum calculated by the integrating sampler 235 is represented by the shaded portion of the Type 2 deviation in FIG. 1.

The integrating sampler 235 continues summing the current above the current threshold until measured current drawn by load 215 falls below the current threshold that is provided by threshold DAC 230. At this point, the integrating sampler 235 will have summed the total current output by the power supply 210 during a Type 2 deviation. This total energy above the threshold is provided as an output by the integrating sampler 235. These total energy measurements may be periodically stored to a register. Embodiments storing total energy values in a register may also include software functions that are configured to periodically read these values from the register for use in generating reports that describe the detected Type 2 deviations.

Using the information generated by the Type 1 even circuit 245, the Type 2 event duration circuits 240 and the integrating sampler 235, the power monitor 200 is able to provide a detailed description of the deviations in the output of power supply 210. These descriptions can provide information regarding the peak magnitude and frequency of Type 1 deviations and the frequency and total energy output of Type 2 deviations. This information can then be used to diagnose the root cause of the deviations. As described, in some cases, Type 2 deviations will occur by design in order to accommodate turbo-type power modes. In these situations, the energy output of these intentional Type 2 deviations still provides information that can be used to estimate the heat and resulting stress that should be expected. When a Type 2 deviation is detected that does not correspond to an instance of an intentional turbo-type power mode, the information provided can be used to diagnose the cause of the deviation.

What is claimed is:
1. A power monitoring circuit comprising:
   monitoring circuitry configured to detect and count transient deviations in the output current of a power supply, wherein detecting a transient deviation comprises:
      comparing the output current with a first threshold current; and
      determining that the output current exceeds the first threshold current; and
   monitoring circuitry configured to detect and measure prolonged deviations in the output current of the power supply, wherein detecting a transient deviation comprises:
      comparing the output current with a second threshold current;
      determining that the output current exceeds the second threshold current;
      determining a duration during which the output current exceeds the second threshold current;
      comparing the determined duration with a duration threshold; and
      determining that the duration exceeds the duration threshold.

2. The power monitor according to claim 1, comprising a shunt resistor for determining the output current of the power supply.

3. The power monitor according to claim 1, wherein the first threshold current and the second threshold current are the same.

4. The power monitor according to claim 1, further comprising:
   monitoring circuitry configured to store the peak current of the power supply output measured during a detected transient deviation.

5. The power monitor according to claim 1, further comprising:
   monitoring circuitry configured to track and store the number of detected transient deviations.

6. The power monitor according to claim 1, further comprising:
   monitoring circuitry configured to store the duration of detected prolonged deviations in the output current of the power supply.

7. The power monitor according to claim 1, further comprising:
   monitoring circuitry configured to calculate a total deviation output energy of the power supply during the duration of detected prolonged deviations.

8. The power monitor according to claim 7, wherein the monitoring circuitry that calculates the total deviation output comprises an integrating sampler.

9. The power monitor according to claim 8, wherein the integrating sampler does not include the output current of the power supply that is below the threshold current in calculating the total deviation output energy.

10. The power monitor according to claim 1, wherein the monitoring circuitry can be enabled and disabled.

11. A method for monitoring an output current of a power supply, the method comprising:
    detecting transient deviations in the output current of the power supply, wherein detecting each transient deviation comprises:
       comparing the output current with a first threshold current; and
       determining that the output current exceeds the first threshold current; and
    counting the number of detected transient deviations in the output current of a power supply;
    detecting prolonged deviations in the output current of the power supply, wherein detecting each transient deviation comprises:
       comparing the output current with a second threshold current;

determining that the output current exceeds the second threshold current;

measure a duration during which the output current exceeds the second threshold current;

comparing the measured duration with a duration threshold; and determining that the measured duration exceeds the duration threshold.

12. The method according to claim 11, further comprising:

determining the output current of the power supply using a shunt resistor.

13. The method according to claim 11, wherein the first threshold current and the second threshold current are the same.

14. The method according to claim 11, further comprising:

storing the peak current of the power supply output measured during a detected transient deviation.

15. The method according to claim 11, further comprising:

tracking the number of detected transient deviations; and storing the number of detected transient deviations.

16. The method according to claim 11, further comprising:

storing the duration of detected prolonged deviations in the output current of the power supply.

17. The method according to claim 11, further comprising:

calculating a total deviation output energy of the power supply during the duration of detected prolonged deviations.

18. The method according to claim 11, wherein an integrating sampler is used to calculate the total deviation output.

19. The method according to claim 18, wherein the integrating sampler does not include the output current of the power supply that is below the threshold current in calculating the total deviation output energy.

20. The method according to claim 11, further comprising:

disabling the components used for detecting transient deviations in the output current of the power supply, counting the number of detected transient deviations in the output current of a power supply, detecting prolonged deviations in the output current of the power supply, and measuring the duration of detected prolonged deviations in the output current of the power supply.

21. A power monitoring circuit for comprising:

monitoring circuitry configured to:

monitor an output current of a power supply over time, wherein the monitored output current defines a current waveform of the output current over time;

detect a transient deviation in the output current of the power supply by determining that the output current exceeds a first threshold current; and detect a prolonged deviation in the output current of the power supply by determining that the output current exceeds a second threshold current for a duration exceeding a duration threshold; and calculate a total deviation output energy of the power supply during the duration of the detected prolonged deviation, wherein the calculated total deviation output energy of the power supply represents an area under a curve defined by the current waveform during the duration of the detected prolonged deviation.

22. The method according to claim 21, wherein the power monitoring circuit includes an integrating sampler configured to calculate the total deviation output energy of the power supply during the duration of the detected prolonged deviation.

23. The method according to claim 21, wherein the first threshold current and the second threshold current have the same value.

24. The method according to claim 21, wherein the calculated total deviation output energy of the power supply represents an area above a line defined by the second threshold current and below the curve defined by the current waveform during the duration of the detected prolonged deviation.

* * * * *